United States Patent [19]

Schachter et al.

[11] Patent Number: 4,558,340
[45] Date of Patent: Dec. 10, 1985

[54] THIN FILM FIELD EFFECT TRANSISTORS UTILIZING A POLYPNICTIDE SEMICONDUCTOR

[75] Inventors: Rozalie Schachter, Flushing; Marcello Viscogliosi, North Tarrytown; Lewis A. Bunz, Peekskill, all of N.Y.

[73] Assignee: Stauffer Chemical Company, Westport, Conn.

[21] Appl. No.: 619,053

[22] Filed: Jun. 11, 1984

Related U.S. Application Data

[63] Continuation-in-part of Ser. No. 509,175, Jun. 29, 1983, Pat. No. 4,509,066.

[51] Int. Cl.$^4$ .......................................... H01L 29/78
[52] U.S. Cl. ...................................... 357/23.7; 357/2; 357/61; 357/52
[58] Field of Search .................. 357/2, 61, 23.7, 4, 357/52

[56] References Cited

U.S. PATENT DOCUMENTS 4,508,931  4/1985  Michel et al. ............................ 357/2
4,509,066  4/1985  Schachter ................................ 357/2

OTHER PUBLICATIONS

Hayama et al., *Appl. Phys. Lett.*; 36 (9) May 1980.

Weimer, *Proceed. of the IRE*, Jun. 1962, pp. 1462 et seq.

*Primary Examiner*—Martin H. Edlow
*Attorney, Agent, or Firm*—F. Eugene Davis, IV

[57] ABSTRACT

Thin film field effect transistors utilize $MP_x$ as the active switched semiconductor where M is at least one alkali metal, P is at least one pnictide, and x ranges from 15 to infinity. Phosphorus is preferred as the dominant pnictide and potassium is preferred as the dominant alkali metal. The local order of the semiconductors may vary from an all parallel pentagonal tube-like structure to a layer-like puckered sheet structure. The all parallel pentagonal tube structure is preferred. Metal insulated semiconductor (MISFETS) and metal semiconductor (MESFETS) field effect transistors are disclosed. The semiconductor is preferably doped with up to approximately $\frac{1}{2}\%$ nickel, iron, or chromium, to reduce the density of defect levels in the bandgap without increasing the conductivity. The semiconductors may be doped with $\frac{1}{2}$–1% of the same metals to increase conductivity so as to provide normally ON devices. The regions of a semiconductor under the source and drain may be heavily doped with 2–3% of the same metals to provide good contact to the source and drain. Nickel is the preferred metal. The insulating layer may be $SiO_2$, $Al_2O_3$, or $Si_3N_4$, but is preferably $P_3N_5$ to provide chemical continuity to the polypnictide semiconductor.

41 Claims, 7 Drawing Figures

THIN FILM FIELD EFFECT TRANSISTORS UTILIZING A POLYPNICTIDE SEMICONDUCTOR

RELATED APPLICATIONS

This application is a continuation-in-part of our co-pending application SPUTTERED SEMICONDUCTING FILMS OF CATENATED PHOSPHORUS MATERIALS AND DEVICES FORMED THRERFROM, Ser. No. 509,175, filed June 29, 1983, now U.S. Pat. No. 4,509,066, which application is incorporated herein by reference. This application is also related to the following co-pending applications, assigned to the same assignee as this application. These applications are incorporated herein by reference. U.S. Patent Application entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; MONOCLINIC PHOSPHORUS FORMED FROM VAPOR IN THE PRESENCE OF AN ALKALI METAL, Ser. No. 419,537, filed Sept. 17, 1982; CATENATED PHOSPHORUS MATERIALS, THEIR PREPARATION AND USE, AND SEMICONDUCTOR AND OTHER DEVICES EMPLOYING THEM, Ser. No. 442,208, filed Nov. 16, 1982, which is a continuation-in-part of Ser. Nos. 335,706 and 419,537; VACUUM EVAPORATED FILMS OF CATENATED PHOSPHORUS MATERIAL, Ser. No. 509,159, filed June 29, 1983; GRAPHITE INTERCALATED ALKALI METAL VAPOR SOURCES, Ser. No. 509,157, filed June 29, 1983; MIS DEVICES EMPLOYING ELEMENTAL PNICTIDE OR POLYPHOSPHIDE INSULATING LAYERS, Ser. No. 509,210, June 29, 1983; LIQUID PHASE GROWTH OF CRYSTALLINE POLYPHOSPHIDE, Ser. No. 509,158, filed June 29, 1983; THERMAL CRACKERS FOR FORMING PNICTIDE FILMS IN HIGH VACUUM PROCESSES, Ser. No. 581,139, filed Feb. 17, 1984; PASSIVATION AND INSULATION OF III-V DEVICES WITH PNICTIDES, PARTICULARLY AMORPHOUS PNICTIDES HAVING A LAYER-LIKE STRUCTURE, Ser. No. 581,115, filed Feb. 17, 1984; PNICTIDE BARRIERS IN QUANTUM WELL DEVICES Ser. No. 581,140, filed Feb. 17, 1984; USE OF PNICTIDE FILMS FOR WAVEGUIDING IN OPTO-ELECTRONIC DEVICES, Ser. No. 581,171, filed Feb. 17, 1984; VACUUM DEPOSITION PROCESSES EMPLOYING A CONTINUOUS PNICTIDE DELIVERY SYSTEM, PARTICULARLY SPUTTERING, Ser. No. 581,103, filed Feb. 17, 1984; CONTINUOUS PNICTIDE SOURCE AND DELIVERY SYSTEM FOR FILM DEPOSITION, PARTICULARLY BY CHEMICAL VAPOR DEPOSITION, Ser. No. 581,102, filed Feb. 17, 1984; METHOD OF PREPARING HIGH PURITY WHITE PHOSPHORUS, Ser. No. 581,105, filed Feb. 17, 1984; PNICTIDE TRAP FOR VACUUM SYSTEMS, Ser. No. 581,101, filed Feb. 17, 1984; HIGH VACUUM DEPOSITION PROCESSES EMPLOYING A CONTINUOUS PNICTIDE DELIVERY SYSTEM, Ser. No. 581,104, filed Feb. 17, 1984; NOVEL POLYPHOSPHIDE SEMICONDUCTORS WITH GOOD INTERFACIAL PROPERTIES TO InP, Ser. No. 588,948, filed Mar. 13, 1984; PASSIVATION OF THE GaAs SURFACE BY AN AMORPHOUS P OVERLAYER, Ser. No. 588,952, filed Mar. 13, 1984; OPTICAL AND RAMAN INVESTIGATIONS OF AMORPHOUS POLYPHOSPHIDES, Ser. No. 588,946, filed Mar. 13, 1984; and, SEMICONDUCTOR PROPERTIES OF POLYPHOSPHIDES, Ser. No. 588,949, filed Mar. 13, 1984.

TECHNICAL FIELD

This invention relates to thin film field effect transistors utilizing a polypnictide semiconductor. More particularly, it relates to semiconducting films of catenated phosphorus materials; to metal insulated field effect transistors (MISFETS); to and metal semiconductor field effect transistors (MESFETS); to the modification and doping of polyphosphide semiconductors; to insulating layers utilized on polyphosphide semiconductors; to plasma sputtering; and to the manufacture of electronic semiconductor devices, thin films, electro-optical devices, displays, and the like.

BACKGROUND ART

Electronic switching devices are needed for large area matrix applications such as displays, particularly liquid crystal displays. These devices are utilized to switch on and off the individual elements (pixels) of the display and to address these individual pixel switches. Thin film transistors are desired for both of these applications.

Great difficulty has been experienced utilizing presently known semiconductors in such thin film devices. It is therefore highly desirable that other, or more easily fabricated and utilized semiconductors be provided for these applications.

The above-identified co-pending applications disclose a new class of semiconductors, namely high pnictide polypnictide semiconductors having the formula $MP_x$, where M is an alkali metal, P is one or more pnictides, and x ranges from 15 to infinity.

We have disclosed in our above-identified co-pending application, Ser. No. 509,175, filed June 29, 1983, and entitled SPUTTERED SEMICONDUCTING FILMS OF CATENATED PHOSPHORUS MATERIAL AND DEVICES FORMED THEREFROM that such polyphosphide semiconductors may be deposited as amorphous thin films to form electronic devices. More recently it has been suggested that a Group V (pnictide) containing dielectric ($P_3N_5$) be utilized to prevent loss of the volatile Group V element from III-V semiconductors and to be used as the I layer deposited thereon. (Y. Hirota and T. Kobayaski, J. Appl. Phys. 53, 5037 (1982)).

DISCLOSURE OF THE INVENTION

We form thin film transistor structures on glass substrates utilizing amorphous $KP_{15}$ as the active semiconductor. For example, to form a MESFET, as shown in FIG. 1, we deposit a high resistivity $KP_{15}$ layer on a glass substrate by RF diode plasma sputtering. We then form an n layer of $KP_{15}$ doped with approximately 1% nickel in the same sputterer without breaking the vacuum. Metal contacts which may preferably be titanium, are then deposited by electron beam evaporation.

We form insulated gate field effect transistor (IGFET) structures, as illustrated in FIG. 2, by first depositing a titanium gate on glass by electron beam evaporation, then depositing an insulating layer of such materials as $SiO_2$, $Al_2O_3$, or $Si_3N_4$ by conventional electron beam deposition, sputtering, or preferably by plasma enhanced CVD. Preferably, however, we deposit as our insulating layer $P_3N_5$ by RF plasma sputtering utilizing a nitrogen atmosphere and providing $P_4$ molecules utilizing the method and apparatus disclosed in the above-identified co-pending application of Schachter and Viscogliosi entitled VACUUM DEPOSITION PROCESSES EMPLOYING A CONTINUOUS PNICTIDE DELIVERY SYSTEM, PARTICULARLY SPUTTERING, Ser. No. 581,103, filed Feb. 17, 1984. The source and drain contacts are then deposited on the insulating layer and a semiconductor layer of $KP_{15}$ deposited thereover. Alternatively, the gate may be deposited on top of the semiconductor layer, as shown in dotted lines in FIG. 2, rather than being deposited on the glass substrate, as shown in solid lines.

The semiconductor $KP_{15}$ preferably has deposited therewith slightly less than $\frac{1}{2}\%$ of nickel, iron, or chromium, which reduces the density of defect levels in the bandgap without significantly increasing the conductivity of the semiconductor.

Alternatively, the semiconductor may be heavily doped, that is, with greater than $\frac{1}{2}\%$, preferably about 1% nickel, iron, or chromium, which effectively increases the conductivity to form a device which is normally ON and can be turned off by the field effect rather than an undoped normally OFF device which is turned on by the field effect. Various forms of thin film transistors that may be formed according to our invention are illustrated in FIGS. 3, 4, 5, and 6. Some of these have the advantage that adjacent semiconductor and insulating layers can be deposited successively in a plasma sputterer without breaking the vacuum.

An n+region of heavily doped (2–3% Ni) $KP_{15}$ may be deposited directly under the source and drain as shown in FIG. 7. These layers are highly conductive and provide good contact between the main semiconductor body and the source and drain.

OBJECTS OF THE INVENTION

It is therefore an object of the invention to provide thin film transistors.

Another object of the invention is to provide field effect transistors.

A further object of the invention is to provide MISFETS and MESFETS.

Still another object of the invention is to provide an insulating layer for transistors of the above character.

Yet another object of the invention is to provide such transistors that may be utilized in large area matrix applications, particularly displays such as liquid crystal displays and the like.

A still further object of the invention is to provide transistors of the above character utilizing a polypnictide semiconductor.

A yet further object of the invention is to provide an insulating layer for transistors of the above character.

Another object of the invention is to provide methods for fabricating transistors of the above character.

Other objects of the invention will in part be obvious and will in part appear hereinafter.

The invention accordingly comprises constructions possessing the features of construction, elements, and arrangements of parts, articles of manufacture possessing the features, properties, and relations of elements; and methods comprising the several steps and relation of one or more of such steps with respect to each of the others for making such articles and constructions which are exemplified in this application. The scope of the invention is indicated in the claims.

BRIEF DESCRIPTION OF THE DRAWINGS

For a fuller understanding of the nature and objects of the invention, reference should be made to the following detailed description, taken in connection with the accompanying drawings, in which.

The same reference characters refer to the same elements throughout the several views of the drawings.

BEST MODE FOR CARRYING OUT THE INVENTION

A field effect transistor is called a "unipolar" transistor to distinguish it from the bipolar (junction) transistors in which both types of carriers (p and n) are involved. The field effect transistor is a three terminal device in which lateral current flow is controlled by an externally applied vertical electric field.

Figure 1:
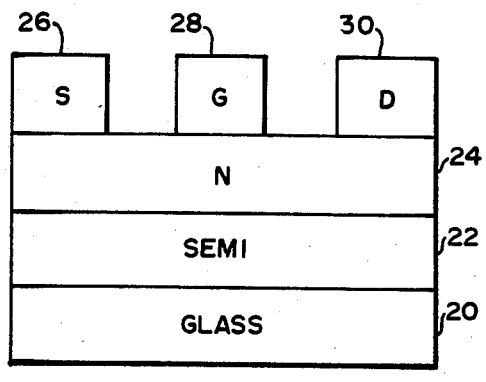
FIG. 1 is a diagrammatic cross sectional view of a thin film Schottky barrier field effect transistor (MESFET) according to the invention.

A Schottky barrier thin film field effect transistor that is a thin film metal semiconductor field effect transistor (MESFET) structure according to the invention is shown in FIG. 1. It comprises a glass substrate 20, a high pnictide polypnictide semiconductor 22 of high resistivity, a metal (approximately 1% Ni) doped layer 24 of the same semiconductor material of lower resistivity, and metal source 26, gate 28, and drain 30 contacts deposited on layer 24.

The n channel is modulated by a Schottky barrier at the interface of the gate and the n layer.

Figure 2:
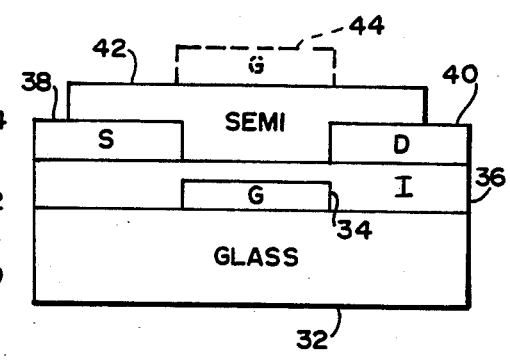
FIG. 2 is a diagrammatic cross sectional view of a thin film insulated gate field effect transistor (IGFET), a type of metal insulated field effect transistor (MISFET) according to the invention.
Figure 3:
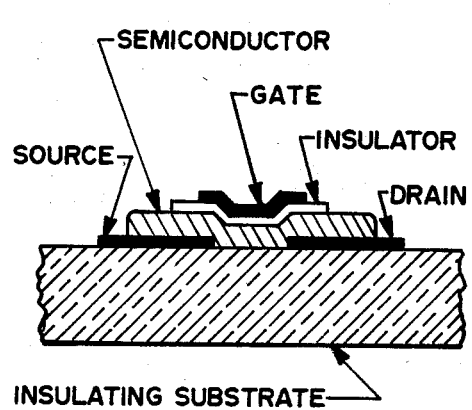
FIGS. 3, 4, 5, and 6, are alternative forms of thin film MISFETS according to the invention.
Figure 4:
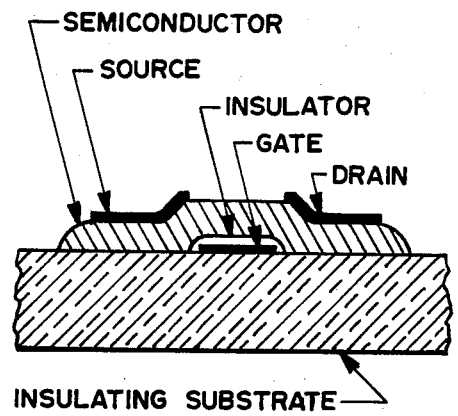
Figure 5:
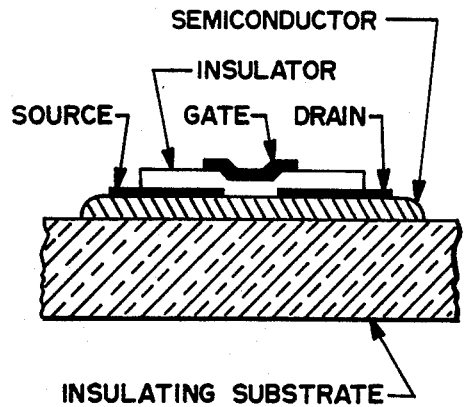
Figure 6:
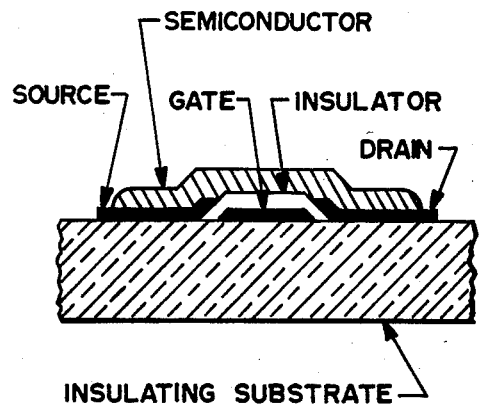

The insulated gate field effect transistor (IGFET) is the most general device of this nature and the most applicable to thin film transistors (TFT). In the most general form the channel is modulated by a metal insulator semiconductor junction, that is, the device is a metal insulator semiconductor field effect transistor (MISFET). Such a device according to the invention is illustrated in FIG. 2. Here a glass substrate 32 has deposited thereon a metal gate contact 34. An insulating layer 36 is deposited over the gate 34 and the glass 32. Then metal source and drains 38 and 40 respectively are deposited on the insulating layer 36. According to the invention a semiconducting polypnictide layer 42 is then deposited over the source and drains and the exposed I layer 36 over the gate 34. The I layer can be an oxide, an insulating dielectric or a combination thereof.

Alternatively, the gate 44 may be located on top of the semiconductor layer 42 as shown in dotted lines. Commonly fabricated thin film transistor structures such as illustrated in FIGS. 3, 4, 5, and 6, may be formed according to the invention utilizing a polypnictide semiconductor. The semiconductor layer according to the invention may be a high resistivity undoped polypnictide in which case the devices are normally OFF and switched ON by the field effect. Alternatively, the semiconductor may be heavily doped with approximately 1% metal to increase their conductivity, in which case the devices would be operated normally ON and turned OFF by the field effect.

Figure 7:
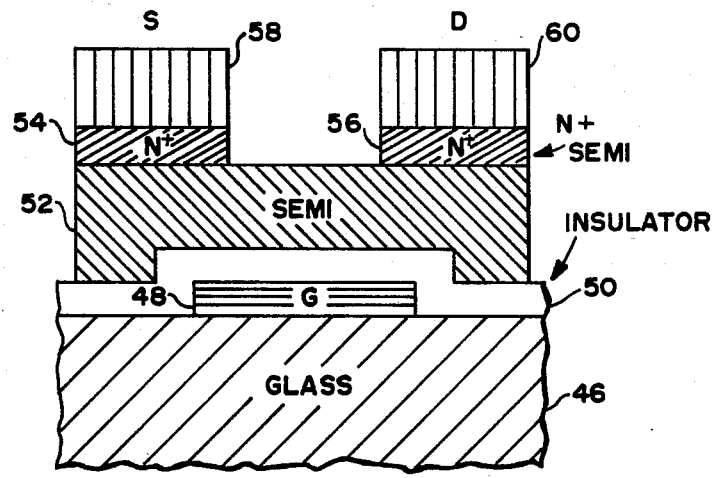
FIG. 7 is an alternative form of thin film MISFET similar to FIG. 4, according to the invention.

If the devices employ a high resistivity undoped semiconductor (metal content less than about ½%) it is desirable that heavily doped n+ layers be utilized under the source and drain for good contact to the undoped semiconductor. For example, as illustrated in FIG. 7, the glass substrate 46 has first deposited thereon a metal gate 48, then the insulator layer 50, then the high resistance, undoped semiconducting polypnictide 52, then the doped n+ layers 54 and 56 which are just under the metal source and drains 58 and 60.

A device with this structure would have a low current carrying capability and require a low voltage at the gate. Such a device would be most suitable for addressing liquid crystal matrix arrays.

Thin film transistors according to the invention are fabricated as follows:

Referring to FIG. 2, a plurality of metal gate electrodes such as electrode 34 are deposited on the glass substrate 32. Any suitable metal may be employed, however, titanium is preferred since it can be deposited by electron beam evaporation, shows no reaction with polypnictides and sticks to glass well. The length of the gate, that is, the distance between the source and drains 38 and 40, can vary from 10–100 microns. The thickness of the gate is not critical, but may conveniently be between 2,000 and 6,000 angstroms. We have utilized 7059 glass as the substrate in an electron beam evaporator at room temperature. The metal gate electrodes may be defined by lithographic techniques such as lift-off.

The insulating layer may be conventional, that is, $SiO_2$ may be deposited by electron beam evaporation on the glass 32 and gates 34, heated to between 300°–400° C., or $Al_2O_3$ may be deposited in an electron beam evaporator also on a heated substrate. An $Si_3N_4$ insulating layer 36 may be deposited according to prior art techniques on a room temperature substrate by RF diode sputtering.

Alternatively, these materials $SiO_2$, $Al_2O_3$, and $Si_3N_4$, preferably may be deposited by plasma enhanced chemical vapor deposition.

However, we believe that $P_3N_5$ would provide the best I layer for these devices. While it may be deposited by a two-source thermal deposition technique, as utilized in the prior art to apply it to III-V semiconductors, we prefer to deposit $P_3N_5$ by the method and in the RF diode sputtering apparatus disclosed in our above-identified co-pending application, Ser. No. 509,175, utilizing the continuous pnictide delivery system disclosed in above-identified copending application of Schachter and Viscogliosi entitled VACUUM DEPOSITION PROCESSES EMPLOYING A CONTINUOUS PNICTIDE DELIVERY SYSTEM, PARTICULARLY SPUTTERING, Ser. No. 581,103, filed Feb. 17, 1984. A nitrogen atmosphere is used and $P_4$ species supplied by the pnictide delivery system (phosphorus bubbler), the substrate being heated to approximately 300° C.

In all cases the insulating layer is 1,000 to 5,000 angstroms in thickness and it may be defined by depositing through a photoresist or utilizing a lift-off technique.

After the I layer has been deposited, source 38 and drain 40 are deposited by conventional electron beam evaporation to a thickness of 2,000 to 4,000 angstroms. Any suitable metal may be employed, however, we have found that titanium is best for pnictide containing insulating and semiconducting layers, such as $P_3N_5$ and $KP_{15}$.

A polypnictide semiconducting layer 42 is then deposited in accordance with the two immediately above-identified co-pending applications in an RF diode sputterer utilizing the continuous pnictide source for $P_4$ species disclosed in Ser. No. 581,103. Preferred polypnictide semiconductors have the formula $MP_x$, where M is an alkali metal, P is a pnictide, and x ranges from 15 to infinity. The preferred pnictide is phosphorus and the preferred alkali metal is potassium, and x if preferably 15. Furthermore, $KP_{15}$ where P is phosphorus is the preferred material. However, minor amounts of other pnictides such as arsenic, antimony, and bismuth may be incorporated into the dominant phosphorus pnictide semiconductor layer.

The semiconductor layer 42 is preferably 5,000 to 10,000 angstroms in thickness.

Those skilled in the art will understand that structures wherein the semiconductor and insulator layers are deposited successively, such as semiconductor, then insulator (FIG. 3), insulator, then semiconductor (FIG. 4), have the advantage that the polypnictide semiconductor and a pnictide containing insulator $P_3N_5$ or $Si_3N_4$ may successively be deposited in an RF plasma sputterer without breaking the vacuum.

We prefer that a compatible metal be incorporated into the polypnictide semiconductor layer to reduce the density of defect levels in the bandgap, but not so much as to cause a significant increase in conductivity. We have found that approximately ½% or a little less of nickel, iron, or chromium performs this function and that nickel is preferred.

Such highly resistive layers provide for normally OFF devices.

Alternatively, normally ON devices may be provided by incorporating approximately 1% or more of the same metals which increase the conductivity of the semiconductor.

We believe that other methods may be employed to deposit the high pnictide polypnictide semiconducting layers of our devices, such as chemical vapor deposition, or molecular flow deposition, as disclosed in the above-identified co-pending applications. The semiconducting layers may range from 5,000 to 10,000 angstroms in thickness.

Now referring to FIG. 7, when the semiconductor 52 is of high resistivity, that is contains no more than approximately ½% of metal additive, we prefer to provide heavily doped, that is 2–3% metal, layers 54 and 56 under the source and drain to provide for good contact between the source and drain. These layers, which are typically 500–3,000 angstroms thick, are heavily doped with 2–3% iron, chromium, or nickel, preferably nickel. These layers may be deposited in the same sputtering apparatus as the semiconductor layer 52, without breaking the vacuum utilizing a composite target of $KP_{15}$ and nickel as disclosed in our above-identified copending application Ser. No. 509,175.

The metal contacts 58 and 60 which again are preferably titanium, are deposited as a source and drain. We use lithography to define the source and drain and etch the polypnictide layer 52 back to the insulator 50 to isolate individual devices on a single glass substrate 46. Holes are etched through the insulating layer 50 to access the gates 48.

In the MESFET structure illustrated in FIG. 1, the n layer is typically 5,000–10,000 angstroms in thickness.

The high resistivity layer 22 of $KP_{15}$ is deposited on glass 20 in an RF sputtering apparatus as disclosed in our aboveidentified co-pending application Ser. No. 509,176 from a $KP_{15}$ target and thereafter the n layer of $KP_{15}$ doped with approximately 1% nickel is deposited in the same apparatus without breaking the vacuum from a composite target as disclosed in our above-identified co-pending application.

We utilize an argon atmosphere, pressed $KP_{15}$ targets in our sputtering apparatus to deposit the $KP_{15}$ layers and add metal pieces to targets used to deposit doped $KP_{15}$ layers, all as disclosed in our above-identified co-pending application. We supply excess $P_4$ using the phosphorus bubbler disclosed in the above-identified application Ser. No. 581,103.

When the structure permits, successive undoped and doped layers may be deposited by switching between appropriate targets and the I layers of $P_3N_5$ or $Si_3N_4$ may be deposited by switching to a nitrogen atmosphere and using the phosphorus bubbler for $P_3N_5$ or a silicon target for $Si_3N_4$, all without breaking the vacuum.

All of the thin film layers of the various structures and articles disclosed herein are preferably amorphous.

All periodic table references are the table printed in the inside front cover of the 60th Edition of *The Handbook of Chemistry and Physics* published by the CRC Press Inc., Boca Raton, Florida. Alkali metals are identified thereon and herein in Group 1a and pnictides in Group 5A. All ranges stated herein are inclusive of their limits.

It will thus be seen that the objects set forth above among those made apparent from the preceding description are efficiently attained and since certain changes may be made in carrying out the above methods and in the above articles and products without departing from the scope of the invention, it is intended that all matter contained in the above decription shall be interpreted as illustrative and not in a limiting sense.

It is also to be understood that the following claims are intended to cover all of the generic and specific features of the invention herein described and all statements of the scope thereof which as a matter of language might be said to fall therebetween.

Particularly, it is to understood that in such claims, ingredients or compounds recited in the singular are intended to include compatible mixtures of such ingredients whenever the sense permits.

Having described our invention, what we claim as new and desire to secure by Letters Patent is:

1. A thin film transistor comprising, as a switched semiconductor portion thereof, a thin film of $MP_x$ where M is at least one alkali metal, P is at least one pnictide, and x ranges substantively between 15 and infinity.

2. A thin film transistor as defined in claim 1 wherein said transistor is a MESFET.

3. A thin film transistor as defined in claim 1 wherein said transistor is a MISFET.

4. A thin film transistor as defined in claim 1 and a thin film insulating layer in contact with said thin film of $MP_x$.

5. A thin film transistor as defined in claim 4 wherein said insulating layer consists essentially of $SiO_2$.

6. A thin film transistor as defined in claim 4 wherein said insulating layer consists essentially of $Al_2O_3$.

7. A thin film transistor as defined in claim 4 wherein said insulating layer consists essentially of $Si_3N_4$.

8. A thin film transistor as defined in claim 4 wherein said insulating layer comprises a compound containing a pnictide.

9. A thin film transistor as defined in claim 4 wherein said insulating layer consists essentially of a compound containing a pnictide.

10. A thin film transistor as defined in claim 4 wherein said insulating layer comprises at least one compound comprising nitrogen and at least one other pnictide.

11. A thin film transistor as defined in claim 4 wherein said insulating layer comprises $P_3N_5$, where N is nitrogen and P is at least one pnictide.

12. A thin film transistor as defined in claim 11 wherein said P in said $P_3N_5$ comprise phosphorus.

13. A thin film transistor as defined in claim 11 wherein said P in said $P_3N_5$ consist essentially of phosphorus.

14. A thin film transistor as defined in claim 4 wherein said insulating layer consists essentially of $P_3N_5$ where N is nitrogen and P is at least one pnictide.

15. A thin film transistor as defined in claim 14 wherein said P in said $P_3N_5$ comprises phosphorus.

16. A thin film transistor as defined in claim 14 wherein said P in said $P_3N_5$ consists essentially of phosphorus.

17. A thin film transistor as defined in claim 1 wherein said semiconductor portion comprises a minor amount of a metal to reduce the density of defect levels in the band gap.

18. A thin film transistor as defined in claim 17 wherein said metal is chosen from the group consisting of iron, chromium, and nickel 19. A thin film transistor as defined in claim 17 wherein the presence of said metal does not substantially reduce the resistivity of said semiconductor portion.

20. A thin film transistor as defined in claim 19 wherein said metal comprises substantially less than $\frac{1}{2}$% of the atoms of said semiconductor portion.

21. A thin film transistor as defined in claim 20 wherein said metal is chosen from the group consisting of iron, chromium, and nickel.

22. A thin film transistor as defined in claim 21 wherein said metal is nickel.

23. A thin film transistor as defined in claim 1 wherein said semiconductor portion comprises a minor amount of a metal to substantially increase the conductivity of at least a part of said semiconductor portion.

24. A thin film transistor as defined in claim 23 wherein said metal is chosen from the group consisting of iron, chromium, and nickel.

25. A thin film transistor as defined in claim 23 wherein said metal comprises substantially more than $\frac{1}{2}$% of the atoms of said part of said semiconductor portion.

26. A thin film transistor as defined in claim 25 wherein said metal comprises substantially more than 1% of the atoms of said part of said semiconductor portion.

27. A thin film transistor as defined in claim 26 wherein said part lies adjacent to, and in contact with, a metal layer of said transistor.

28. A thin film transistor as defined in claim 1, and a metal layer in contact with said semiconductor layer, comprising titanium.

29. A thin film transistor as defined in claim 1, and a metal layer in contact with said semiconductor layer, consisting essentially of titanium.

30. A thin film transistor as defined in any one of claims 1 through 29 wherein said semiconductor portion consists essentially of $KP_{15}$.

31. A thin film transistor as defined in claim 1 wherein said film of $MP_x$ is amorphous.

32. An insulated semiconductor device comprising as the switched semiconductor portion thereof a layer of $MP_x$, where M is at least one alkali metal, P is at least one pnictide, and x ranges substantially between 15 and infinity, and an insulating layer comprising a pnictide.

33. A semiconductor device as defined in claim 32 wherein said insulating layer comprises nitrogen.

34. A semiconductor device as defined in claim 33 wherein said insulating layer comprises at least one other pnictide besides nitrogen.

35. A semiconductor device as defined in claim 33 wherein said insulating layer comprises $P_3N_5$.

36. A semiconductor device as defined in claim 33 wherein said insulating layer consists essentially of $P_3N_5$.

37. A semiconductor device as defined in any one of claims 32 through 36 wherein said pnictide is phosphorus.

38. A semiconductor device as defined in claim 37 wherein x is 15.

39. A semiconductor device as defined in claim 38 wherein said alkali metal is potassium.

40. A semiconductor device as defined in claim 39 wherein said semiconductor portion is amorphous.

41. A semiconductor device as defined in any one of claims 32 through 36 wherein said semiconductor portion is amorphous.

* * * * *